(12) United States Patent
Mongia et al.

(10) Patent No.: US 7,957,131 B1
(45) Date of Patent: Jun. 7, 2011

(54) ELECTRONIC DEVICE THERMAL MANAGEMENT

(75) Inventors: Rajiv K. Mongia, Fremont, CA (US); Mark MacDonald, Beaverton, OR (US); Eduardo Hernandez-Pacheco, Beaverton, OR (US); Jered H. Wikander, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/655,147

(22) Filed: Dec. 23, 2009

(51) Int. Cl.
*H05K 7/20* (2006.01)

(52) U.S. Cl. ............ 361/679.46; 361/679.54; 361/704; 361/719

(58) Field of Classification Search .......... None
See application file for complete search history.

(56) References Cited

U.S. PATENT DOCUMENTS

| | | | |
|---|---|---|---|
| 6,055,156 A * | 4/2000 | von Gutfeld | 361/690 |
| 6,491,528 B1 * | 12/2002 | McLean | 439/76.1 |
| 6,933,990 B2 * | 8/2005 | Park | 349/59 |
| 6,982,481 B1 * | 1/2006 | Sonderegger et al. | 257/713 |
| 7,286,360 B2 * | 10/2007 | Sohn | 361/704 |
| 7,417,861 B2 * | 8/2008 | Kikuchi et al. | 361/718 |
| 7,480,145 B2 * | 1/2009 | Ali | 361/708 |
| 7,808,572 B2 * | 10/2010 | Lee et al. | 349/58 |
| 2006/0291161 A1 * | 12/2006 | Tran et al. | 361/688 |
| 2009/0207569 A1 * | 8/2009 | Tsunoda et al. | 361/704 |

* cited by examiner

*Primary Examiner* — Boris L Chervinsky
(74) *Attorney, Agent, or Firm* — Caven & Aghevli LLC

(57) ABSTRACT

An electronic device comprises a housing, at least one heat generating component in the housing, and at least one thermal management device in thermal communication with the at least one heat generating component, wherein the at least one thermal management device selectively allocates heat flow to one or more portions of the housing. Other embodiments may be described.

18 Claims, 5 Drawing Sheets

ELECTRONIC DEVICE THERMAL MANAGEMENT

RELATED APPLICATIONS

None.

BACKGROUND

The subject matter described herein relates generally to the field of electronic devices and more particularly to thermal management in electronic devices.

In electronic devices such as notebook and laptop computers, personal digital assistants (PDAs), and the like there are three major mechanisms of heat transport: conduction, convection, and radiation. Improving conduction and convection have been the one focus for developing technologies in the electronics cooling industry. Examples include improved thermal interface materials better and graphite materials, which provide improved conduction, structural modifications which provide improved convection and the introduction of ionic wind to provide better convection.

Although neglected from a technology perspective, radiation transport is extremely important for transport of heat within a notebook. For example, approximately half the heat transported to the skin is in the form of thermal radiation. Although significant work has been done on improving the conduction and convection, very little work has been done in improving the radiation transport mechanisms within the notebook. Accordingly, techniques to improved thermal management of radiation may find utility.

BRIEF DESCRIPTION OF THE DRAWINGS

The detailed description is described with reference to the accompanying figures.

DETAILED DESCRIPTION

Described herein are exemplary systems and methods for thermal management in electronic devices. In the following description, numerous specific details are set forth to provide a thorough understanding of various embodiments. However, it will be understood by those skilled in the art that the various embodiments may be practiced without the specific details. In other instances, well-known methods, procedures, components, and circuits have not been illustrated or described in detail so as not to obscure the particular embodiments.

Figure 1:
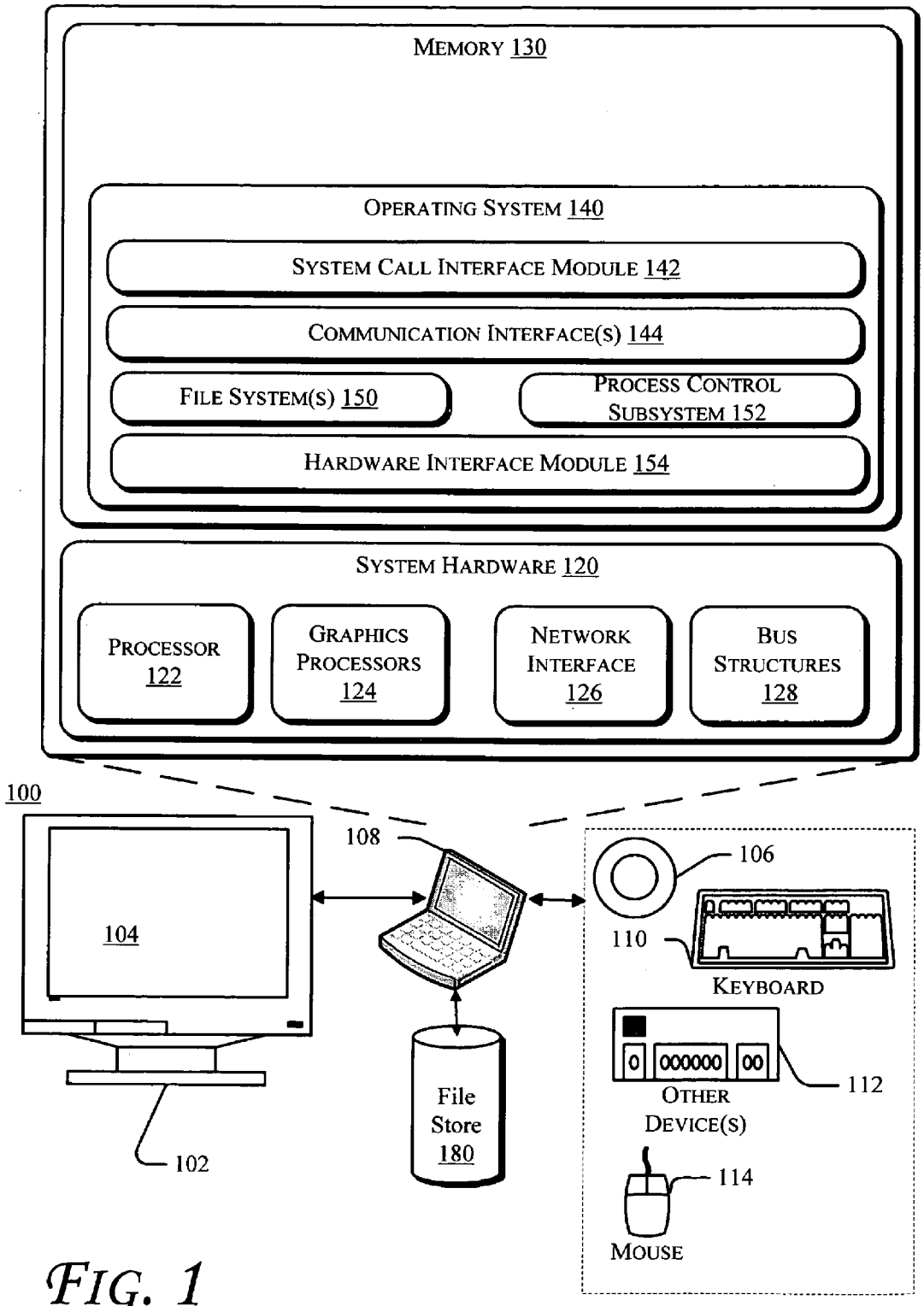
FIG. 1 is a schematic illustration of an exemplary electronic device which may be adapted to implement thermal management in accordance with some embodiments.

FIG. 1 is a schematic illustration of an exemplary system which may be adapted to implement thermal management in accordance with some embodiments. In one embodiment, system 100 includes an electronic device 108 and one or more accompanying input/output devices including a display 102 having a screen 104, one or more speakers 106, a keyboard 110, one or more other I/O device(s) 112, and a mouse 114. The other I/O device(s) 112 may include a touch screen, a voice-activated input device, a track ball, and any other device that allows the system 100 to receive input from a user.

In various embodiments, the electronic device 108 may be embodied as a personal computer, a laptop computer, a personal digital assistant, a mobile telephone, an entertainment device, or another computing device. In one embodiment, the computing device further comprises a housing having a lid 107.

The electronic device 108 includes system hardware 120 and memory 130, which may be implemented as random access memory and/or read-only memory. A file store 180 may be communicatively coupled to computing device 108. File store 180 may be internal to computing device 108 such as, e.g., one or more hard drives, CD-ROM drives, DVD-ROM drives, or other types of storage devices. File store 180 may also be external to computer 108 such as, e.g., one or more external hard drives, network attached storage, or a separate storage network.

System hardware 120 may include one or more processors 122, at least two graphics processors 124, network interfaces 126, and bus structures 128. In one embodiment, processor 122 may be embodied as an Intel® Core2 Duo® processor available from Intel Corporation, Santa Clara, Calif., USA. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit.

Graphics processor(s) 124 may function as adjunct processor that manages graphics and/or video operations. Graphics processor(s) 124 may be integrated onto the motherboard of computing system 100 or may be coupled via an expansion slot on the motherboard.

In one embodiment, network interface 126 could be a wired interface such as an Ethernet interface (see, e.g., Institute of Electrical and Electronics Engineers/IEEE 802.3-2002) or a wireless interface such as an IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a general packet radio service (GPRS) interface (see, e.g., Guidelines on GPRS Handset Requirements, Global System for Mobile Communications/GSM Association, Ver. 3.0.1, December 2002).

Bus structures 128 connect various components of system hardware 128. In one embodiment, bus structures 128 may be one or more of several types of bus structure(s) including a memory bus, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

Memory 130 may include an operating system 140 for managing operations of computing device 108. In one embodiment, operating system 140 includes a hardware interface module 154 that provides an interface to system hardware 120. In addition, operating system 140 may include a file system 150 that manages files used in the operation of computing device 108 and a process control subsystem 152 that manages processes executing on computing device 108.

Operating system 140 may include (or manage) one or more communication interfaces that may operate in conjunction with system hardware 120 to transceive data packets and/or data streams from a remote source. Operating system 140 may further include a system call interface module 142 that provides an interface between the operating system 140 and one or more application modules resident in memory 130. Operating system 140 may be embodied as a UNIX operating system or any derivative thereof (e.g., Linux, Solaris, etc.) or as a Windows® brand operating system, or other operating systems.

As described above, thermal management remains an issue in electronic device such as, e.g., electronic devices 108. Various techniques and device configurations for thermal management in such electronic devices are described herein.

IR Window Embodiments

In some embodiments an electronic device 108 may be configured to include one or more infrared (IR) windows positioned on selected portions of the chassis skin. The IR window provides enhanced passive energy dissipation from an electronic device 108. The extra cooling results from improved radiative heat transfer through the IR window.

In some embodiments an IR window is formed in one or more portions of the upper cover of the electronic device The IR Window provides a heat transfer path from the hot internal components to the cooler ambient environment. In various embodiments an IR window may comprise at least one of a heat spreader and an IR window structure. The heat spreader spreads thermal energy from hot components, creating a larger surface area for radiative heat transfer. The IR window permits energy to radiate from the system by radiation heat transfer with the environment. In some embodiments an IR window may be located in the top cover of the chassis. The window may be designed to increase cooling by radiation and natural convection without exposing the internals of the system.

Figure 2:
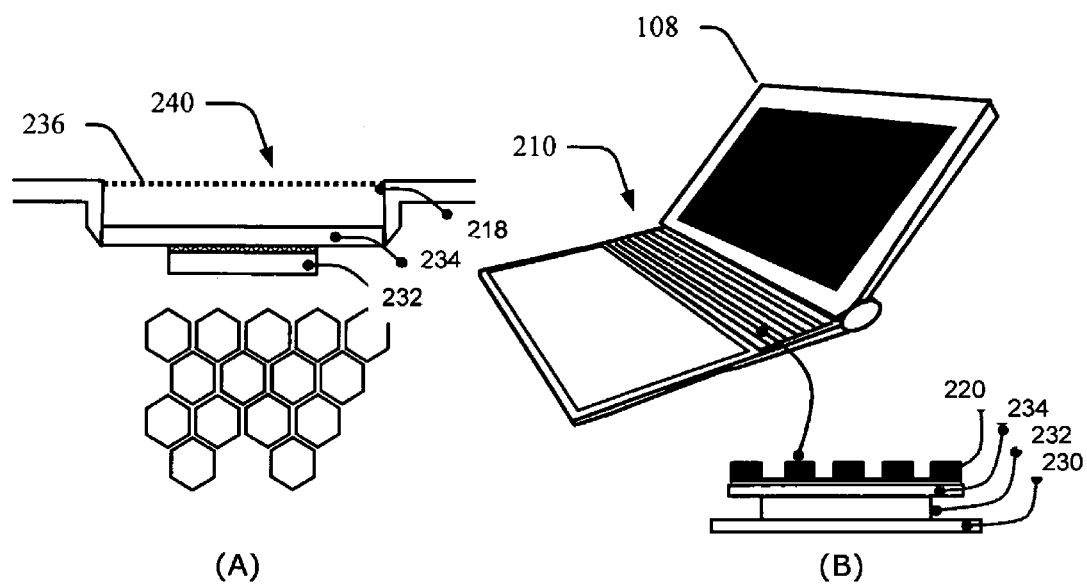
FIG. 2A is a schematic illustration of an exemplary configurations for an infrared radiation window in an electronic device in accordance with some embodiments.
FIG. 2B is a schematic illustration of an exemplary configuration for an electronic device comprising a passive radiator, according to embodiments.

Referring to FIG. 2B, in one embodiment an electronic device 108 is provided with an IR window 210 that includes a passive heat radiator element 220. The passive radiator 220 provides a larger temperature difference for IR thermal radiation transport without compromising ergonomic outer surface skin temperature limits in a simple and low cost geometry. In the configuration depicted in FIG. 2B, the passive heat radiator element comprises a base and a set of short, low thermal conductivity (e.g., plastic) ribs, fin, pins or other heat sink-like features attached directly to the spreader. The ribs and the base may be constructed using a low thermal conductivity plastic (e.g., a thermal conductivity factor k=0.1 W/mK). Therefore, the tips of ribs remain at an ergonomically (comfortably) low temperature so they are not hot to touch for the user. The base of the structure (i.e., the base of the ribs) is at a significantly higher temperature, and is able to radiate heat directly to the ambient environment. In some embodiments the ribs may be spaced appropriately to prevent user contact with base of the ribs. Further, the thickness of the rib thickness may be chosen to provide a comfortable, touchable exterior surface (i.e., not thin and sharp).

In some embodiments the system comprises a circuit board 230 and one or more heat generating components 232 mounted to the circuit board 230. By way of example, in some embodiments the heat generating component(s) 232 may comprise an integrated circuit component (e.g., a processor or the like) or a component such as a hard drive. A heat spreader 234 may be positioned in thermal communication with the heat generating component(s) 232. In operation, heat generated by the heat generating components 232 is removed by the heat spreader 234, and then is removed by conduction to the base of the radiator 220. From the base, heat is dissipated by all three modes of heat transfer (i.e., conduction, convection and radiation). Thus the radiator provides an effective heat path from the hot components to the cooler environment. Performance can be further enhanced by extending the ribbed portion of the radiator right to the edge of the system, which enhances natural convection flow between the ribs.

In the embodiment depicted in FIG. 2A, an IR transparent window 240 may be located in the top surface of the electronic device 108 that allows the internal heat generating components 232 to radiate directly with the ambient environment. This directional IR interaction between heat generating components 232 and ambient environment provides for a larger temperature difference, and thus greater heat dissipation. The IR window 240 may be made of any number of materials including solid (e.g., germanium, water-free quartz, calcium fluoride, magnesium fluoride), thin film materials that may or not be supported be some sort of open frame structure (e.g., thin film polyethylene), or an open mesh structure. In an embodiment which utilizes an open mesh structure, an internal heat spreader 234 may be sealed to the edges of the IR window in order to maintain acceptable protection for the internal components from external ingress of foreign materials, e.g., liquids/debris/fingers.

In the example shown in FIG. 2A a mesh-like structure 236 positioned in the top cover of the system, above the internal components of the system. In some embodiments the mesh structure 236 may comprise a honeycomb mesh with an open area ratio greater than 75%. The mesh structure may be formed from a material having high emissivity (e.g., more than 0.9) for improving radiative dissipation, and to keep the mesh relatively cool (since it can be touched by the user, and hence needs to meet ergonomic temperature limits). The internal face of the mesh can also be treated to improve its reflective properties. A heat spreader 234 underneath the window (2 mm below in this example) is in direct thermal contact with the heat generating components 232 of the system. The heat spreader 234 may also be treated to increase its emissivity properties. Heat is then radiated out from the spreader to the environment. The window allows radiative heat to pass through, and exposes the hot spreader to the cooler air outside the system, providing added convection opportunities, further enhancing overall thermal performance.

In some embodiments the walls between the passive window edges and the spreader are fully sealed. Experiments conducted on a prototype for this technology indicate 1 W of extra cooling, assuming typical conditions in laptop system for a window area of 70 cm2. Surface temperatures at the mesh structure remained comparable to the same system using its conventional plastic chassis (closed top cover).

While this amount of cooling may not be of consequence for an actively cooled system, it represents a significant improvement for passive system cooling that will have an impact on overall system performance.

IR Reflective Materials Embodiments

In some electronic devices approximately fifty percent (50%) of the heat that is transported to the skin of an electronic device is in the form of IR radiation. Radiation transport between a motherboard and the skin can be represented by the following expression (assuming "infinite" plates):

$$Q_{1->2} = \frac{\sigma(T_1^4 - T_2^4)}{1/\varepsilon_1 + 1/\varepsilon_2 - 1} \quad \text{Eq. (1)}$$

As shown in the above equation, the radiation transport ($Q1 \rightarrow 2$) is highly dependent on the emissivity of both the emitting and absorbing surfaces. The emissivity of the emitting (i.e., hot) surface is not readily controllable since the heat-emitting surface is typically a circuit board and/or electrical components on the circuit board. However, the receiving surface in this case is the interior surface of the housing of the electronic device.

The inner surface of the many electronic devices is formed from plastic, EMI shielding, or a spreader material. In the case of plastic, the emissivity, (e) is approximately equal to 1. Some housings are coated with a spray-on EMI shielding which also exhibits a high emissivity. In the case of spreaders, in theory there is potential for a low emissivity (highly polished aluminum for example); however, it is difficult to achieve this in practice due to oxidation or other material changes.

Figure 3:
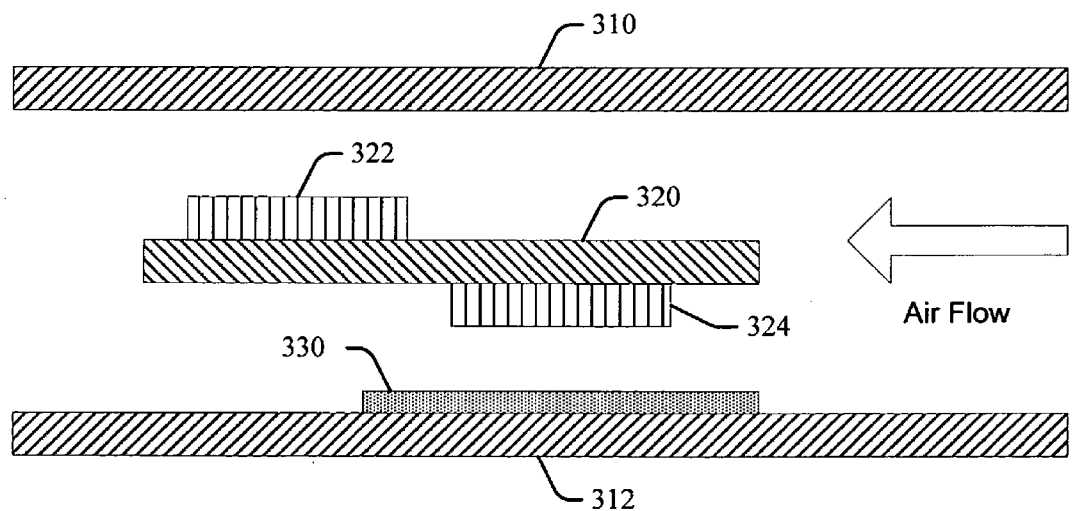
FIG. 3 is a schematic, cross-sectional illustration of components of an electronic device, in accordance with some embodiments.

FIG. 3 is a schematic, cross-sectional illustration of components of an electronic device, in accordance with some embodiments. Referring to FIG. 3, in some embodiments at least a portion of the interior surface of the housing either the upper skin 310 or the lower skin 312 of the housing may be covered with a patch 330 formed from a thin, IR property "tunable" material to reduce the amount of infrared radiation that is absorbed into the skin of the device. The patch 330 reflects a portion of the IR radiation incident on the patch 330 by a heat generating component 324 or 322, or by a circuit board 320, thereby selectively reducing the amount of heat transmitted through the skin in a region proximate to the patch 330.

IR Transparent Top Skins

Figure 4A:
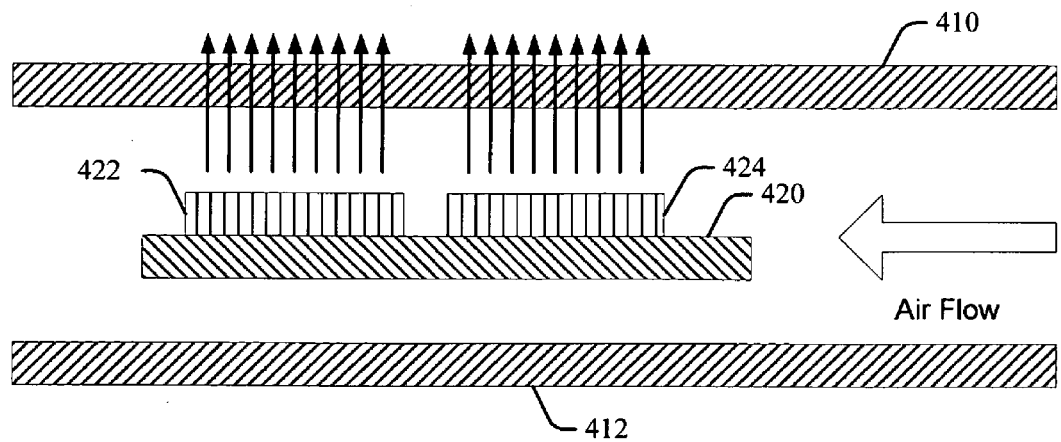
FIGS. 4A and 4B are schematic illustrations of exemplary configurations for an electronic device in which a portion of the housing is radiation transmissive in accordance with some embodiments.
Figure 4B:
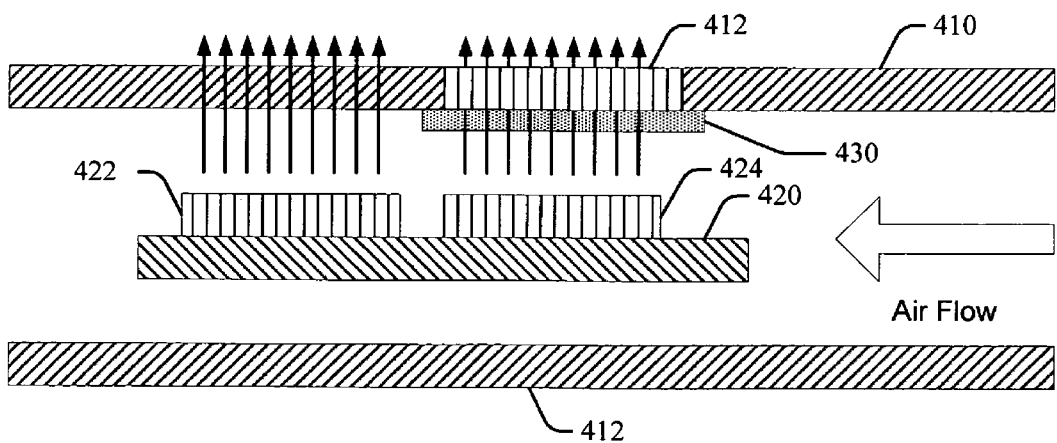

In another embodiment the amount of heat that gets transported to the skin may be reduced by reducing the absorption of the radiation by the skin. FIGS. 4A and 4B are schematic illustrations of exemplary configurations for an electronic device in which a portion of the housing is radiation transmissive in accordance with some embodiments. Referring First to FIG. 4A, in some embodiments portions of the housing 410 may be formed from a radiation-transmissive material such that IR radiation generated by one or more heat generating components 422, 424 and circuit board 420 may be transmitted through the skin 410 and to the ambient environment. Increasing the amount of IR radiation heat which may be transmitted through the upper skin 410 reduces the amount of heat left to pass through the lower skin 412.

There are a variety of options which may be implemented in order to achieve the IR transparency in portions of the upper skin 410. For example, the portions of the skin 410 can be made from a material that is transparent in the 5-15 micrometer (um) wavelength range, which are critical wavelengths for IR transmission at notebook temperatures. In other embodiments portions of the skin may be formed such that the skin is porous to IR radiation, as illustrated in Fig. B.

Referring briefly to FIG. 4B, in some embodiments one or more portions 412 of the skin 410 may be formed such that the skin is porous to IR radiation, e.g., by forming the skin 410 with a plurality of holes extending through the skin 410. In some embodiments an IR transparent fabric 430 may be positioned proximate the porous portions 412 of the skin 410. To ensure that EMI and RF interference does not occur, the fabric can be made electrically conductive and grounded to prevent the interference.

Radiation Shielding

Figure 5:
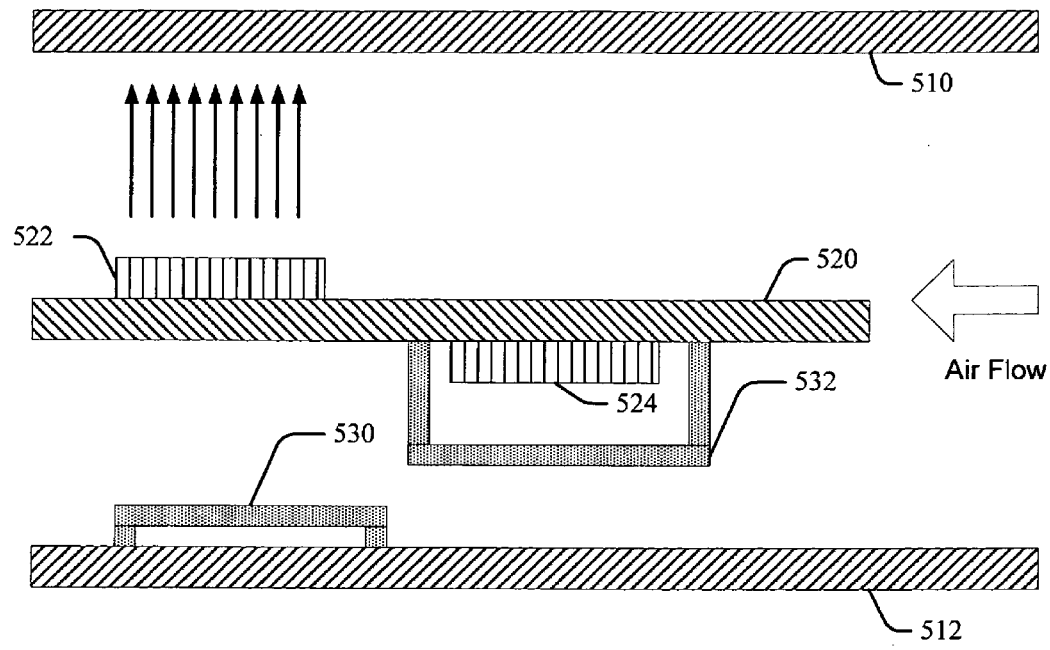
FIG. 5 is a schematic, cross-sectional illustration of components of an electronic device, in accordance with some embodiments.

In other embodiments one or more radiation shields may be positioned in the housing to reduce IR radiation transmission through portions of the housing. FIG. 5 is a schematic, cross-sectional illustration of components of an electronic device, in accordance with some embodiments. In the embodiment depicted in FIG. 5, a radiation shield 530 is disposed proximate a portion of the lower skin 512 of the housing to inhibit IR radiation transmission to the covered portion of the skin 512, while the upper skin 510 is unaltered. In addition, a second radiation shield 532 is mounted over a heat generating component 524 on circuit board 520 to inhibit IR radiation transmission from the heat-generating component 524 to the covered portion of the skin 512. Heat generating component 522 is not covered. One skilled in the art will recognize that more or fewer shields may be placed in select locations as desired to selectively reduce IR transmission to portions of the upper skin 510 or the lower skin 512.

EMI Shielding

Figure 6:
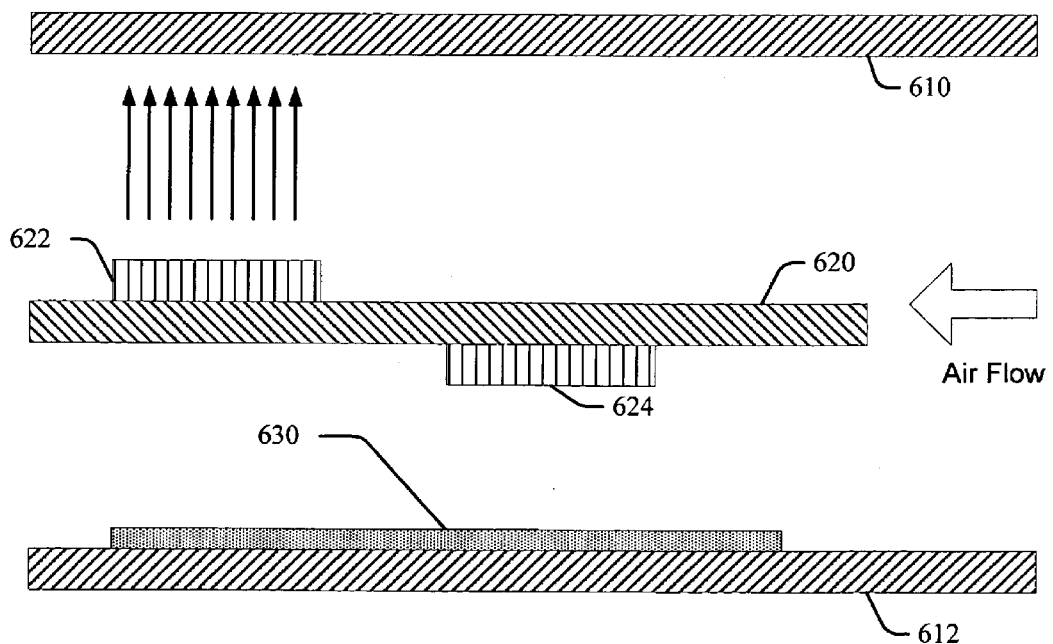
FIG. 6 is a schematic, cross-sectional illustration of components of an electronic device, in accordance with some embodiments.

In other embodiments emissivity characteristics of one or more electromagnetic interference (EMI) shields may be positioned in the housing to reduce IR radiation transmission through portions of the housing. FIG. 6 is a schematic, cross-sectional illustration of components of an electronic device, in accordance with some embodiments. In the embodiment depicted in FIG. 6, a portion of the housing 612 is covered with an (EMI) shielding 630 designed to inhibit the transmission of IR radiation through the housing 612, while the upper skin 610 is unaltered. Heat generating components 622, 624 on circuit board 620 are not covered. One skilled in the art will recognize that in practice the entire surface of the housing, including the upper housing 610, may be covered with an EMI shield.

In some embodiments portions of the EMI shield 630 maybe manipulated to alter the surface emissivity of the EMI shield 630. By way of example, the surface of the EMI shield 630 may be manipulated by polishing, anodizing, painting, or otherwise altering the emissivity of the EMI shield 630.

Figure 7:
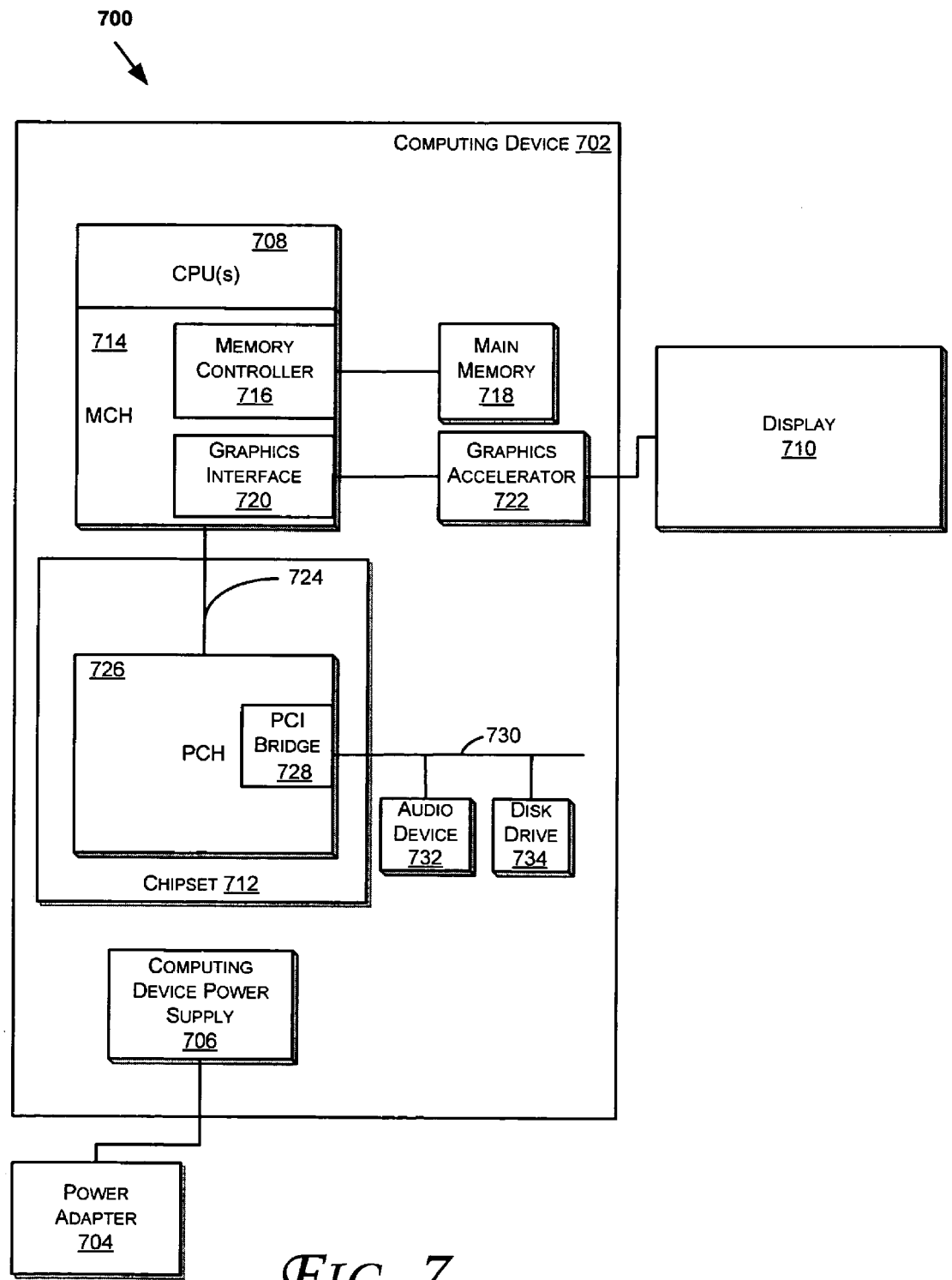
FIG. 7 is a schematic illustration of a system which may be adapted to implement thermal management, according to an embodiment.

FIG. 7 is a schematic illustration of a computer system 700 in accordance with some embodiments. The computer system 700 includes a computing device 702 and a power adapter 704 (e.g., to supply electrical power to the computing device 702). The computing device 702 may be any suitable computing device such as a laptop (or notebook) computer, a personal digital assistant, a desktop computing device (e.g., a workstation or a desktop computer), a rack-mounted computing device, and the like.

Electrical power may be provided to various components of the computing device 702 (e.g., through a computing device power supply 706) from one or more of the following sources: one or more battery packs, an alternating current (AC) outlet (e.g., through a transformer and/or adaptor such as a power adapter 704), automotive power supplies, airplane power supplies, and the like. In some embodiments, the power adapter 704 may transform the power supply source output (e.g., the AC outlet voltage of about 110 VAC to 240

VAC) to a direct current (DC) voltage ranging between about 7 VDC to 12.6 VDC. Accordingly, the power adapter 704 may be an AC/DC adapter.

The computing device 702 may also include one or more central processing unit(s) (CPUs) 708. In some embodiments, the CPU 708 may be one or more processors in the Pentium® family of processors including the Pentium® II processor family, Pentium® III processors, Pentium® IV, or CORE2 Duo processors available from Intel® Corporation of Santa Clara, Calif. Alternatively, other CPUs may be used, such as Intel's Itanium®, XEON™, and Celeron® processors. Also, one or more processors from other manufactures may be utilized. Moreover, the processors may have a single or multi core design.

A chipset 712 may be coupled to, or integrated with, CPU 708. The chipset 712 may include a memory control hub (MCH) 714. The MCH 714 may include a memory controller 716 that is coupled to a main system memory 718. The main system memory 718 stores data and sequences of instructions that are executed by the CPU 708, or any other device included in the system 700. In some embodiments, the main system memory 718 includes random access memory (RAM); however, the main system memory 718 may be implemented using other memory types such as dynamic RAM (DRAM), synchronous DRAM (SDRAM), and the like. Additional devices may also be coupled to the bus 710, such as multiple CPUs and/or multiple system memories.

The MCH 714 may also include a graphics interface 720 coupled to a graphics accelerator 722. In some embodiments, the graphics interface 720 is coupled to the graphics accelerator 722 via an accelerated graphics port (AGP). In some embodiments, a display (such as a flat panel display) 740 may be coupled to the graphics interface 720 through, for example, a signal converter that translates a digital representation of an image stored in a storage device such as video memory or system memory into display signals that are interpreted and displayed by the display. The display 740 signals produced by the display device may pass through various control devices before being interpreted by and subsequently displayed on the display.

A hub interface 724 couples the MCH 714 to an platform control hub (PCH) 726. The PCH 726 provides an interface to input/output (I/O) devices coupled to the computer system 700. The PCH 726 may be coupled to a peripheral component interconnect (PCI) bus. Hence, the PCH 726 includes a PCI bridge 728 that provides an interface to a PCI bus 730. The PCI bridge 728 provides a data path between the CPU 708 and peripheral devices. Additionally, other types of I/O interconnect topologies may be utilized such as the PCI Express™ architecture, available through Intel® Corporation of Santa Clara, Calif.

The PCI bus 730 may be coupled to an audio device 732 and one or more disk drive(s) 734. Other devices may be coupled to the PCI bus 730. In addition, the CPU 708 and the MCH 714 may be combined to form a single chip. Furthermore, the graphics accelerator 722 may be included within the MCH 714 in other embodiments.

Additionally, other peripherals coupled to the PCH 726 may include, in various embodiments, integrated drive electronics (IDE) or small computer system interface (SCSI) hard drive(s), universal serial bus (USB) port(s), a keyboard, a mouse, parallel port(s), serial port(s), floppy disk drive(s), digital output support (e.g., digital video interface (DVI)), and the like. Hence, the computing device 702 may include volatile and/or nonvolatile memory.

The terms "logic instructions" as referred to herein relates to expressions which may be understood by one or more machines for performing one or more logical operations. For example, logic instructions may comprise instructions which are interpretable by a processor compiler for executing one or more operations on one or more data objects. However, this is merely an example of machine-readable instructions and embodiments are not limited in this respect.

The terms "computer readable medium" as referred to herein relates to media capable of maintaining expressions which are perceivable by one or more machines. For example, a computer readable medium may comprise one or more storage devices for storing computer readable instructions or data. Such storage devices may comprise storage media such as, for example, optical, magnetic or semiconductor storage media. However, this is merely an example of a computer readable medium and embodiments are not limited in this respect.

The term "logic" as referred to herein relates to structure for performing one or more logical operations. For example, logic may comprise circuitry which provides one or more output signals based upon one or more input signals. Such circuitry may comprise a finite state machine which receives a digital input and provides a digital output, or circuitry which provides one or more analog output signals in response to one or more analog input signals. Such circuitry may be provided in an application specific integrated circuit (ASIC) or field programmable gate array (FPGA). Also, logic may comprise machine-readable instructions stored in a memory in combination with processing circuitry to execute such machine-readable instructions. However, these are merely examples of structures which may provide logic and embodiments are not limited in this respect.

Some of the methods described herein may be embodied as logic instructions on a computer-readable medium. When executed on a processor, the logic instructions cause a processor to be programmed as a special-purpose machine that implements the described methods. The processor, when configured by the logic instructions to execute the methods described herein, constitutes structure for performing the described methods. Alternatively, the methods described herein may be reduced to logic on, e.g., a field programmable gate array (FPGA), an application specific integrated circuit (ASIC) or the like.

In the description and claims, the terms coupled and connected, along with their derivatives, may be used. In particular embodiments, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Reference in the specification to "one embodiment" or "some embodiments" means that a particular feature, structure, or characteristic described in connection with the embodiment is included in at least an implementation. The appearances of the phrase "in one embodiment" in various places in the specification may or may not be all referring to the same embodiment.

Although embodiments have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An electronic device, comprising:
   a housing;
   at least one heat generating component in the housing;
   at least one thermal management device in thermal communication with the at least one heat generating component, wherein the at least one thermal management device selectively allocates heat flow to one or more portions of the housing, and wherein the thermal management device comprises:
   a porous window formed in at least one section of the housing; and
   at least one patch formed from a material which transmits infrared radiation disposed proximate the porous window.

2. The electronic device of claim 1, wherein the thermal management device comprises at least one patch formed from a material which reflects infrared radiation disposed on selected locations of an interior surface of the housing.

3. The electronic device of claim 1, wherein the thermal management device comprises a radiation transmissive window formed in at least one section of the housing.

4. The electronic device of claim 3, further comprising at least one heat spreader positioned proximate the radiation transmissive window to spread heat across the window.

5. The electronic device of claim 1, wherein the thermal management device comprises at least one of:
   a cover formed from a material which reflects infrared radiation positioned over the heat generating component in the housing; or
   a cover formed from a material which reflects infrared radiation positioned proximate at least one selected portion of the housing.

6. The electronic device of claim 1, wherein the thermal management device comprises:
   a passive radiator formed in at least one section of the housing; and
   at least one heat spreader positioned proximate the passive radiator to spread heat across the window.

7. The electronic device of claim 6, wherein the passive radiator comprises:
   a base section formed from a material having a high thermal conductivity; and
   a plurality of fins extending from the base and formed from a material having a low thermal conductivity.

8. The electronic device of claim 1, wherein the thermal management device comprises an electromagnetic interference (EMI) shield, and wherein an emissivity characteristic of the EMI shield is altered at selected locations on the shield.

9. The electronic device of claim 8, wherein the selected locations of the EMI shield are subjected to at least one of a polishing operation; an anodizing operation, or a coating operation.

10. A computer system, comprising:
    a housing having an upper skin and a lower skin;
    a circuit board comprising at least one heat generating circuit component; and
    at least one infrared radiation management device in which selectively manages infrared radiation on one or more portions of the housing, and wherein the radiation management device comprises:
    a porous window formed in at least one section of the housing; and
    at least on patch formed from a material which transmits infrared radiation disposed proximate the porous window.

11. The computer system of claim 10, wherein the radiation management device comprises at least one patch formed from a material which reflects infrared radiation disposed on selected locations of an interior surface of the housing.

12. The computer system of claim 10, wherein the radiation management device comprises a radiation transmissive window formed in at least one section of the housing.

13. The computer system of claim 12, further comprising at least one heat spreader positioned proximate the radiation transmissive window to spread heat across the window.

14. The computer system of claim 10, wherein the thermal management device comprises at least one of:
    a cover formed from a material which reflects infrared radiation positioned over the heat generating component in the housing; or
    a cover formed from a material which reflects infrared radiation positioned proximate at least one selected portion of the housing.

15. The computer system of claim 10, wherein the thermal management device comprises:
    a passive radiator formed in at least one section of the housing; and
    at least one heat spreader positioned proximate the passive radiator to spread heat across the window.

16. The computer system of claim 15, wherein the passive radiator comprises:
    a base section formed from a material having a high thermal conductivity; and
    a plurality of fins extending from the base and formed from a material having a low thermal conductivity.

17. The computer system of claim 10, wherein the thermal management device comprises an electromagnetic interference (EMI) shield, and wherein an emissivity characteristic of the EMI shield is altered at selected locations on the shield.

18. The computer system of claim 17, wherein the selected locations of the EMI shield are subjected to at least one of a polishing operation; an anodizing operation, or a coating operation.

* * * * *